(12) United States Patent
Tian

(10) Patent No.: US 10,445,448 B2
(45) Date of Patent: Oct. 15, 2019

(54) METHOD AND SYSTEM FOR CIRCUIT SIMULATION

(71) Applicant: Yu Tian, Jinzhou (CN)

(72) Inventor: Yu Tian, Jinzhou (CN)

(73) Assignee: Yu Tian, Surrey (CA)

( * ) Notice: Subject to any disclaimer, the term of this patent is extended or adjusted under 35 U.S.C. 154(b) by 203 days.

(21) Appl. No.: 15/841,312

(22) Filed: Dec. 14, 2017

(65) Prior Publication Data

US 2019/0188347 A1 Jun. 20, 2019

(51) Int. Cl.
*G06F 17/50* (2006.01)

(52) U.S. Cl.
CPC .................. *G06F 17/5036* (2013.01)

(58) Field of Classification Search
USPC ........................................................... 703/14
See application file for complete search history.

(56) References Cited

U.S. PATENT DOCUMENTS

| 2009/0012770 A1* | 1/2009 | Wasynczuk | G06F 17/5036 703/16 |
| 2011/0094075 A1* | 4/2011 | Lee | H02M 1/44 29/25.41 |
| 2017/0090671 A1* | 3/2017 | Khazeni | G06F 3/0418 |
| 2018/0165389 A1* | 6/2018 | Tian | G06F 17/5036 |

FOREIGN PATENT DOCUMENTS

| CN | 106326509 A | 1/2017 |
| WO | 2017000585 A1 | 1/2017 |

OTHER PUBLICATIONS

Wang et al., "A Time-Domain Equivalent Model of Modular Multilevel Converter and Its Fast Algorithm". Aug. 2013, Power System Technology, vol. 37, No. 8, pp. 2080-2086 (Year: 2013).*
Gnanarathna et al., "Efficient Modeling of Modular Multilevel HVDC Converters (MMC) on Electromagnetic Transient Simulation Programs", Jan. 2011, IEEE Transactions on Power Delivery. vol. 26, No. 1, pp. 316-324 (Year: 2011).*

* cited by examiner

*Primary Examiner* — Jason C Olson

(57) ABSTRACT

Embodiments of the present disclosure provide a method, a system and a computer readable storage medium for circuit simulation, comprising: partitioning circuit into a subcircuit-1 and a subcircuit-2 which are connected through at least one port; generating equivalent circuit of subcircuit-1 based on port current/port voltage, subcircuit-1 port voltage under port open-circuit condition/subcircuit-1 port current under port short-circuit condition, and impulse-response of subcircuit-1 port voltage to port current/impulse-response of subcircuit-1 port current to port voltage; simulating a simplified circuit comprising the subcircuit-2 and the equivalent circuit. Comparing with prior art, this disclosure reduces circuit scale by equivalence of linear portion of circuit. Thereby computation amount for circuit simulation is reduced and the computation time for circuit simulation is shortened.

18 Claims, 7 Drawing Sheets

METHOD AND SYSTEM FOR CIRCUIT SIMULATION

BACKGROUND

Field

The present disclosure relates to circuit simulation, and more particularly to a method, a system, and a computer readable storage medium for circuit simulation.

Description of Related Art

Circuit simulation is widely applied for checking and verifying the design of electrical circuit prior to manufacturing and deployment. It is used across a wide spectrum of applications, ranging from integrated circuits and microelectronics to electrical power transmission or distribution networks and power electronics.

One typical existing circuit simulation method is difference equation method (or referred to by companion circuit method, numerical integration substitution method, or the like). A variation of this method in the field of power system electromagnetic transient simulation is the Electro-Magnetic Transient Program (EMTP) method. According to this method, differential equations describing characteristics of each dynamic element are discretized into difference equations. After conversion, each original dynamic element is represented in the form of companion model (resistance, current source, or resistance in parallel with current source). Algebraic equation set of the circuit is established via nodal method or modified nodal method. The circuit response can then be obtained by repeatedly applying a linear or nonlinear solver in every time-step. Such techniques are commonly implemented in modern circuit simulation software. Examples in electronic circuit simulation software include HSPICE (trademark). Examples in electric circuit simulation software include PSCAD (trademark).

Another typical existing circuit simulation method is state variable method (or referred to by state equation method, numerical integration method, or the like). According to this method, firstly, a set of variables that can fully describe circuit characteristics are selected as state variables, each of differential equation describing the state variable characteristics in the circuit is then combined into a set of differential equations. Then, numerical integration is performed to obtain time-domain solution of the differential equation set. Examples in simulation software include Saber (trademark).

For existing circuit simulation methods, in each simulation time-step, it is required to perform one or more matrix inversion operations, and/or Gaussian elimination operations, and/or LU decomposition operations and/or forward-backward substitution operations of the full size circuit matrix. As the scale of the circuit is continuously expanded, the computation amount for circuit simulation is large, thus the computation time for circuit simulation is long.

SUMMARY

In view of this, embodiments of the present disclosure provide a method, a system, and a computer readable storage medium for circuit simulation, for reducing the computation amount for circuit simulation and shortening the computation time for circuit simulation, comprising: partitioning circuit into a subcircuit-1 and a subcircuit-2 which are connected through at least one port; generating equivalent circuit of subcircuit-1 based on port current/port voltage, subcircuit-1 port voltage under port open-circuit condition/subcircuit-1 port current under port short-circuit condition, and impulse-response of subcircuit-1 port voltage to port current/impulse-response of subcircuit-1 port current to port voltage; simulating a simplified circuit comprising the subcircuit-2 and the equivalent circuit. Comparing with prior art, this disclosure reduces circuit scale by equivalence of linear portion of circuit. Thereby computation amount for circuit simulation is reduced and the computation time for circuit simulation is shortened according to embodiments of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
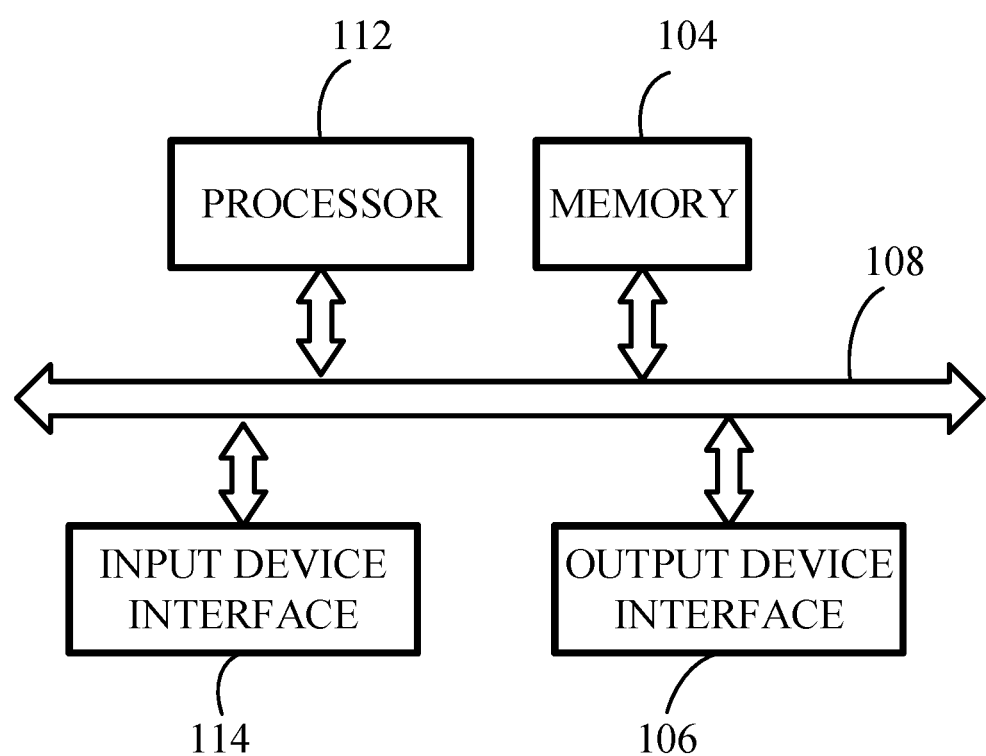
FIG. 1 is a block diagram of a system according to one embodiment.

FIG. 1 illustrates an electronic system 100 with which features of the subject technology may be implemented. The electronic system 100 includes a bus 108, a processor 112, a memory 104, an input device interface 114, and an output device interface 106. The bus 108 collectively represents all system buses that communicatively couple the numerous devices of the electronic system 100. For instance, the bus 108 communicatively couples the processor 112 with the memory 104. In operation, the processor 112 may retrieve instructions from the memory 104 for performing one or more of the functions described herein, and execute the instructions to perform the one or more functions. For example, processor 112 may retrieve instructions for performing one or more circuit simulations according to any of the embodiments discussed, and execute the instructions to perform the one or more circuit simulations. The processor 112 may perform the one or more circuit simulations based on a circuit model of the system stored in the memory 104, and may store results of the one or more circuit simulations in the memory 104. The processor 112 may be a single processor or a multi-core processor in different implementations. The memory 104 may comprise a random access memory (RAM), a read only memory (ROM), a flash memory, registers, a hard disk, a removable disk, a CD-ROM, any other form of storage medium known in the art, or any combination thereof. The bus 108 may also couple to the input and output device interfaces 114 and 106. The input device interface 114 may enable a user to communicate information and select commands to the electronic system 100, and may include, for example, an alphanumeric keyboard and a pointing device (e.g., a mouse). For example, the user may use the input device interface to command the processor 112 to perform a particularly circuit simulation. The output device interface 106 may enable, for example, the display of information generated by the electronic system 100 to a user, and may include, for example, a display device (e.g., liquid crystal displays (LCD)). For example, the output device interface 106 may be used to display results of a circuit simulation to the user.

Figure 2:
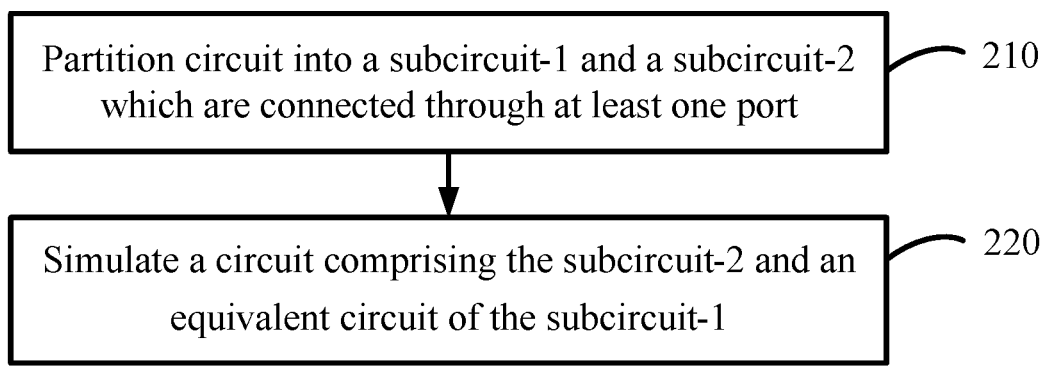
FIG. 2 is a flow diagram of method for circuit simulation according to one embodiment.

FIG. 2 is a flow diagram illustrating a method for circuit simulation, according to one embodiment.

At step 210, the processor partitions a circuit into a subcircuit-1 and a subcircuit-2 which are connected through at least one port.

Figure 3:
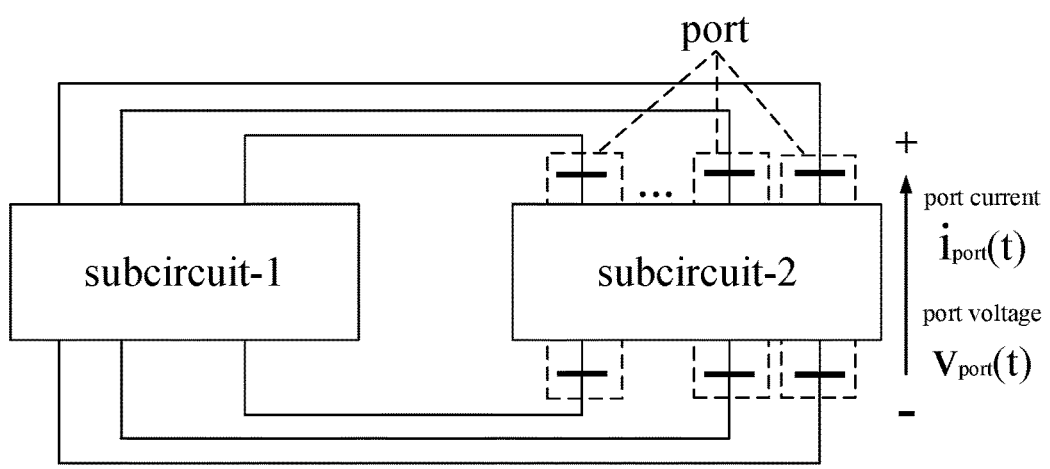
FIG. 3 is a connection diagram of subcircuit-1 and subcircuit-2 according to one embodiment.

Referring to FIG. 3 for a connection diagram of subcircuit-1 and subcircuit-2, according to one embodiment.

A circuit as described herein, according to one embodiment, may include (but not limited to) circuit elements such as sources, resistors, inductors, capacitors, switches, circuit elements representing electronic components (such as resistors, capacitors, inductors, diodes, transistors), circuit elements representing electric components (such as generators, transformers, transmission lines/cables, machines, power electronic components).

A port as described herein, according to one embodiment, refers to a pair of terminals (nodes) connecting a part of circuit to another part of circuit.

In some embodiments, all circuit elements in the subcircuit-1 are linear-time-invariant (LTI). In some alternative embodiments, the subcircuit-1 contains one or more nonlinear elements or one or more time-varying elements or both, since time-varying elements such as switch or non-linear elements such as nonlinear resistor do not satisfy superposition principle, corresponding simulation error (inaccuracy) may be introduced in such embodiments.

At step 220, the processor simulates a circuit comprising the subcircuit-2 and an equivalent circuit of the subcircuit-1.

A simulation as described herein, according to one embodiment, refers to the process of computing the specified output variables (for example output node voltages and/or output branch currents) of a circuit using a computer, as functions of time at a series of discrete time-points, over a specified time-interval (also known as time-step), in a specified time-window. It may also be referred to by transient analysis, transient simulation or time-domain simulation, or the like. The embodiment of the present disclosure is also applicable to simulation of power systems (e.g. electromagnetic transient simulation, electromechanical transient simulation, power electronics simulation, or the like). For example, a simulation may be carried out using Simulink (trademark) software, on computer hardware as illustrated in FIG. 1, or using HSPICE (trademark) software, on computer hardware as illustrated in FIG. 1, or using RSCAD (trademark) software, on RTDS (trademark) simulator hardware. In some cases, source code for the circuit simulation can be directly written in C or C++ directly without using any commercially available off-the-shelf software. The embodiment of the present disclosure is also applicable to such a case, if at least a part of the functions of the present disclosure can be written as circuit simulation.

An equivalent circuit as described herein, according to one embodiment, may be realized in form of relationships, expressions, formulas, equations, voltage-current characteristics, nodal voltage equations, differential algebraic equations, differential equations, algebraic equations, difference equations, state-variable equations, computer program segments, components, models, modules, blocks, or functions, or the like. In one embodiment, for example, an equivalent circuit is realized by an S-function component in Simulink (trademark) software.

Figure 4:
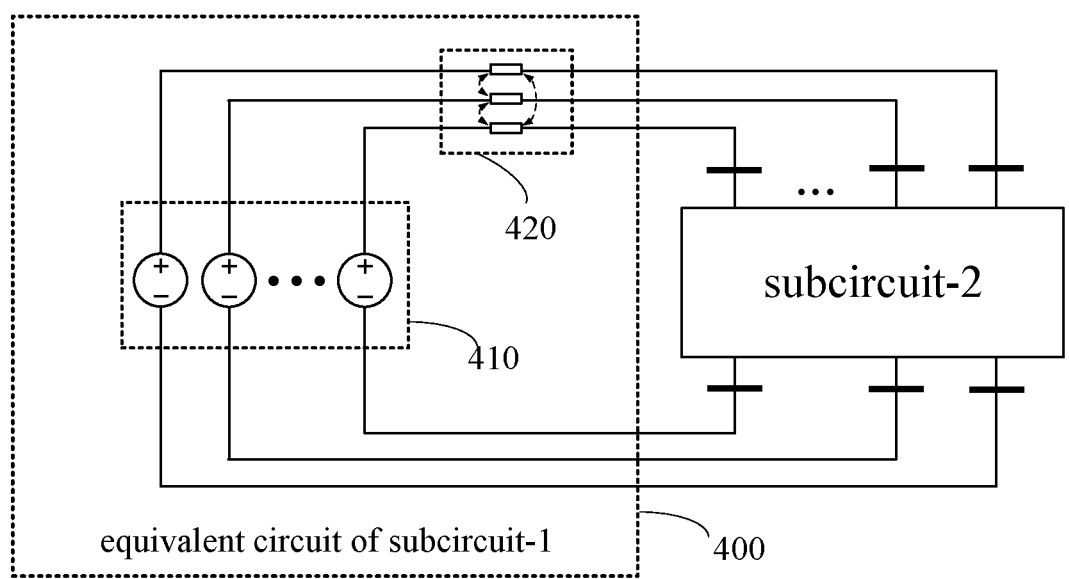
FIG. 4 is a connection diagram of subcircuit-2 and an equivalent circuit of subcircuit-1 according to one embodiment.

Referring to FIG. 4, for a diagram illustrating connection of subcircuit-2 and an equivalent circuit of subcircuit-1, according to one embodiment. The equivalent circuit 400 comprises an equivalent voltage 410 in series with an equivalent resistance 420. The equivalent voltage is obtained by: convolving a port current with an impulse-response of subcircuit-1 port voltage to port current, to obtain a transient-equivalent-voltage; and adding the transient-equivalent-voltage to a subcircuit-1 port voltage under port open-circuit condition. The equivalent resistance is obtained from a selected point (e.g. point corresponding to time 0) of the impulse-response. For example, the equivalent voltage and the equivalent resistance may be obtained from:

$$v_{eq}(t) = v_{eq,0}(t) + \sum_{0 \leq j < t} H_{v-eq}(t-j) \times i_{port}(j)$$

$$R_{eq} = H_{v-eq}(0)$$

wherein: t denotes time corresponding to present simulation time-point, j denotes time of port current, $v_{eq}(t)$ denotes equivalent voltage at time t, $v_{eq,0}(t)$ denotes subcircuit-1 port voltage under port open-circuit condition at time t, $H_{v-eq}(t-j)$ denotes impulse-response of subcircuit-1 port voltage to port current at time (t-j), $i_{port}(j)$ denotes port current at time j, $R_{eq}$ denotes equivalent resistance, $H_{v-eq}(0)$ denotes impulse-response of subcircuit-1 port voltage to port current at time 0.

Figure 5:
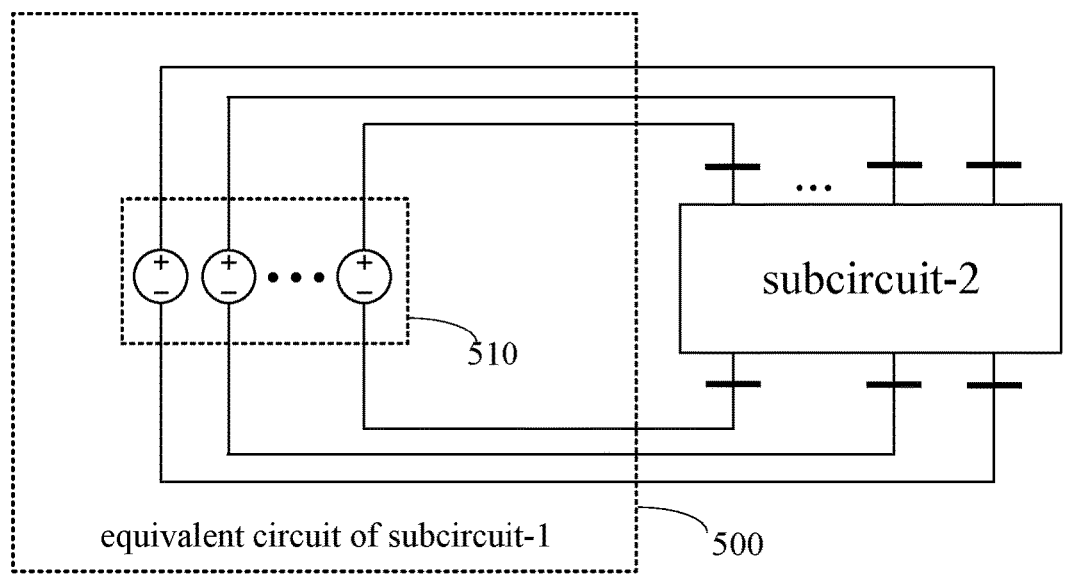
FIG. 5 is a connection diagram of subcircuit-2 and an equivalent circuit of subcircuit-1 according to one embodiment.

Referring to FIG. 5, for a diagram illustrating connection of subcircuit-2 and an equivalent circuit of subcircuit-1, according to another embodiment. The equivalent circuit 500 comprises an equivalent voltage 510. The equivalent voltage is obtained by: convolving a port current with an impulse-response of subcircuit-1 port voltage to port current, to obtain a transient-equivalent-voltage; and adding the transient-equivalent-voltage to a subcircuit-1 port voltage under port open-circuit condition. For example, the equivalent voltage may be obtained from:

$$v_{eq}(t) = v_{eq,0}(t) + \sum_{0 \leq j \leq t} H_{v-eq}(t-j) \times i_{port}(j)$$

wherein: t denotes time corresponding to present simulation time-point, j denotes time of port current, $v_{eq}(t)$ denotes equivalent voltage at time t, $v_{eq,0}(t)$ denotes subcircuit-1 port voltage under port open-circuit condition at time t, $H_{v-eq}(t-j)$ denotes impulse-response of subcircuit-1 port voltage to port current at time (t-j), $i_{port}(j)$ denotes port current at time j.

Figure 6:
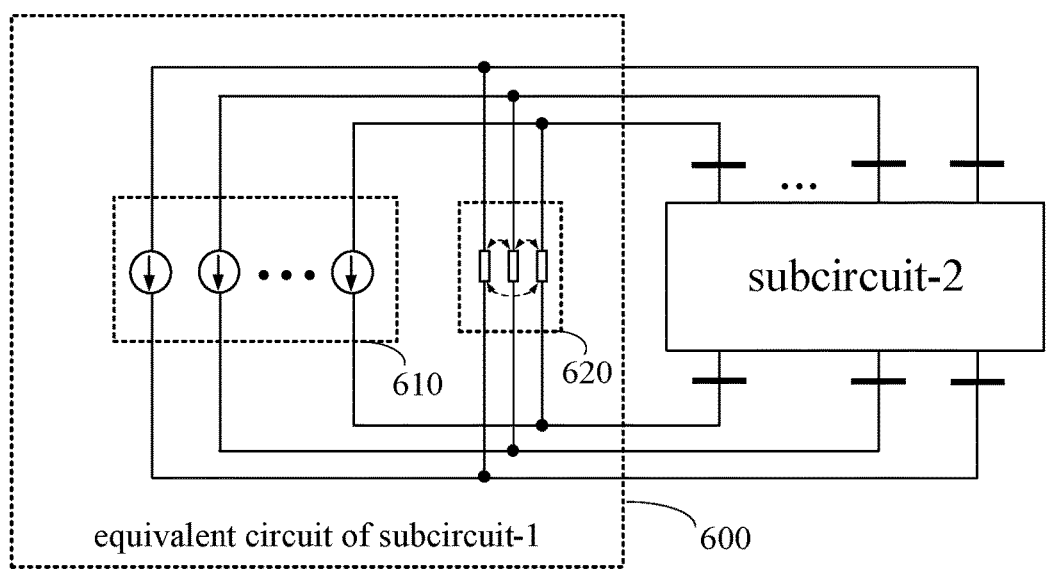
FIG. 6 is a connection diagram of subcircuit-2 and an equivalent circuit of subcircuit-1 according to one embodiment.

Referring to FIG. 6, for a diagram illustrating connection of subcircuit-2 and an equivalent circuit of subcircuit-1, according to yet another embodiment. The equivalent circuit 600 comprises an equivalent current 610 in parallel with an equivalent conductance 620. The equivalent current is obtained by: convolving a port voltage with an impulse-response of subcircuit-1 port current to port voltage, to obtain a transient-equivalent-current; and adding the transient-equivalent-current to a subcircuit-1 port current under port short-circuit condition. The equivalent conductance is obtained from a selected point (e.g. point corresponding to time 0) of the impulse-response. For example, the equivalent current and the equivalent conductance may be obtained from:

$$i_{eq}(t) = i_{eq,0}(t) + \sum_{0 \leq j < t} H_{i-eq}(t-j) \times v_{port}(j)$$

$$G_{eq} = H_{i-eq}(0)$$

wherein: t denotes time corresponding to present simulation time-point, j denotes time of port voltage, $i_{eq}(t)$ denotes equivalent current at time t, $i_{eq,0}(t)$ denotes subcircuit-1 port current under port short-circuit condition at time t, $H_{i-eq}(t-j)$ denotes impulse-response of subcircuit-1 port current to port voltage at time (t-j), $v_{port}(j)$ denotes port voltage at time j, $G_{eq}$ denotes equivalent conductance, $H_{i-eq}(0)$ denotes impulse-response of subcircuit-1 port current to port voltage at time 0.

Figure 7:
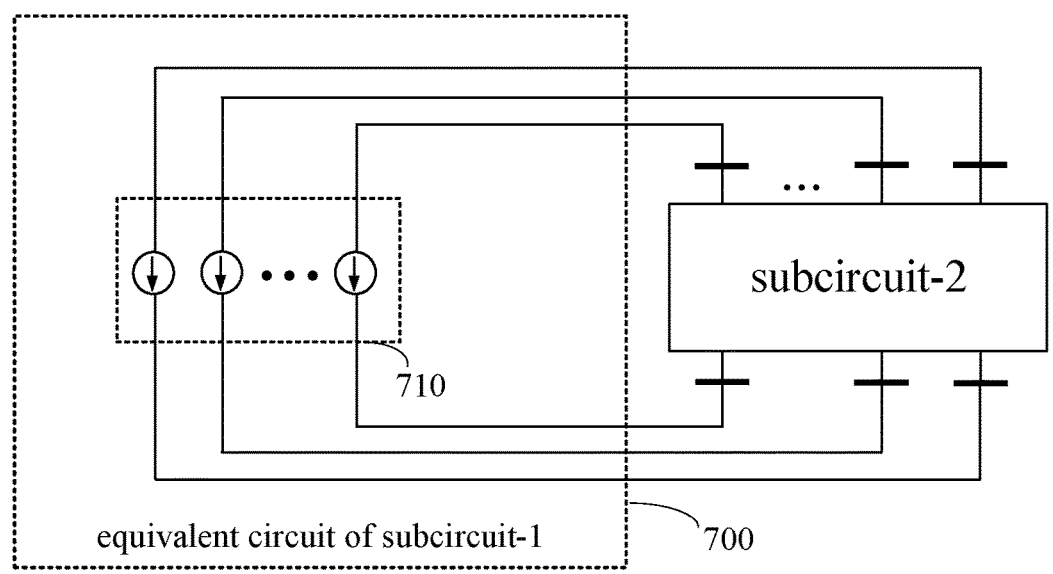
FIG. 7 is a connection diagram of subcircuit-2 and an equivalent circuit of subcircuit-1 according to one embodiment.

Referring to FIG. 7, for a diagram illustrating connection of subcircuit-2 and an equivalent circuit of subcircuit-1, according to still another embodiment. The equivalent circuit 700 comprises an equivalent current 710. The equivalent current is obtained by: convolving a port voltage with an impulse-response of subcircuit-1 port current to port voltage, to obtain a transient-equivalent-current; and adding the transient-equivalent-current to a subcircuit-1 port current under port short-circuit condition. For example, the equivalent current may be obtained from:

$$i_{eq}(t) = i_{eq,0}(t) + \sum_{0 \leq j \leq t} H_{i-eq}(t-j) \times v_{port}(j)$$

wherein: t denotes time corresponding to present simulation time-point, j denotes time of port voltage, $i_{eq}(t)$ denotes equivalent current at time t, $i_{eq,0}(t)$ denotes subcircuit-1 port current under port short-circuit condition at time t, $H_{i-eq}(t-j)$ denotes impulse-response of subcircuit-1 port current to port voltage at time (t-j), $v_{port}(j)$ denotes port voltage at time j.

A port current as described herein, according to one embodiment, refers to a current through the port, as a finite and discrete function of time, as illustrated in FIG. 3. A port voltage as described herein, according to one embodiment, refers to a voltage across two terminals of the port, as a finite and discrete function of time, as illustrated in FIG. 3. A subcircuit-1 port voltage under port open-circuit condition as described herein, according to one embodiment, refers to a voltage across the port of the subcircuit-1, as a finite and discrete function of time, with the port terminals open-circuited. A subcircuit-1 port current under port short-circuit condition as described herein, according to one embodiment, refers to a current through the port of the subcircuit-1, as a finite and discrete function of time, with the port terminals short-circuited.

In one embodiment, if the subcircuit-1 contains output node voltage, such subcircuit-1 output node voltage is obtained by: convolving a port current with an impulse-response of subcircuit-1 output node voltage to port current, to obtain a transient-node-voltage; and adding the transient-node-voltage to a subcircuit-1 output node voltage under port open-circuit condition. For example, subcircuit-1 output node voltage may be obtained from:

$$v(t) = v_0(t) + \sum_{0 \leq j \leq t} H_v(t-j) \times i_{port}(j)$$

wherein: t denotes time corresponding to present simulation time-point, j denotes time of port current, $i_{port}(j)$ denotes port current at time j, v(t) denotes subcircuit-1 output node voltage at time t, $v_0(t)$ denotes subcircuit-1 output node voltage under port open-circuit condition at time t, $H_v(t-j)$ denotes impulse-response of subcircuit-1 output node voltage to port current at time (t-j).

In one embodiment, if the subcircuit-1 contains output branch current, such subcircuit-1 output branch current is obtained by: convolving a port current with an impulse-response of subcircuit-1 output branch current to port current, to obtain a transient-branch-current; and adding the transient-branch-current to a subcircuit-1 output branch current under port open-circuit condition. For example, subcircuit-1 output branch current may be obtained from:

$$i(t) = i_0(t) + \sum_{0 \leq j \leq t} H_i(t-j) \times i_{port}(j)$$

wherein: t denotes time corresponding to present simulation time-point, j denotes time of port current, $i_{port}(j)$ denotes port current at time j, i(t) denotes subcircuit-1 output branch current at time t, $i_0(t)$ denotes subcircuit-1 output branch current under port open-circuit condition at time t, $H_i(t-j)$ denotes impulse-response of subcircuit-1 output branch current to port current at time (t-j).

In one embodiment, if the subcircuit-1 contains output node voltage, such subcircuit-1 output node voltage is obtained by: convolving a port voltage with an impulse-response of subcircuit-1 output node voltage to port voltage, to obtain a transient-node-voltage; and adding the transient-node-voltage to a subcircuit-1 output node voltage under port short-circuit condition. For example, subcircuit-1 output node voltage may be obtained from:

$$v(t) = v_0(t) + \sum_{0 \leq j \leq t} H_v(t-j) \times v_{port}(j)$$

wherein: t denotes time corresponding to present simulation time-point, j denotes time of port voltage, $v_{port}(j)$ denotes port voltage at time j, v(t) denotes subcircuit-1 output node voltage at time t, $v_0(t)$ denotes subcircuit-1 output node voltage under port short-circuit condition at time t, $H_v(t-j)$ denotes impulse-response of subcircuit-1 output node voltage to port voltage at time (t-j).

In one embodiment, if the subcircuit-1 contains output branch current, such subcircuit-1 output branch current is obtained by: convolving a port voltage with an impulse-response of subcircuit-1 output branch current to port voltage, to obtain a transient-branch-current; and adding the transient-branch-current to a subcircuit-1 output branch current under port short-circuit condition. For example, subcircuit-1 output branch current may be obtained from:

$$i(t) = i_0(t) + \sum_{0 \leq j \leq t} H_i(t-j) \times v_{port}(j)$$

wherein: t denotes time corresponding to present simulation time-point, j denotes time of port voltage, $v_{port}(j)$ denotes port voltage at time j, i(t) denotes subcircuit-1 output branch current at time t, $i_0(t)$ denotes subcircuit-1 output branch current under port short-circuit condition at time t, $H_i(t-j)$ denotes impulse-response of subcircuit-1 output branch current to port voltage at time (t−j).

In one embodiment, a steady-state-response of subcircuit-1 (may include one or more of: subcircuit-1 port voltage under port open-circuit condition, subcircuit-1 port current under port short-circuit condition, subcircuit-1 output node voltage under port open-circuit condition, subcircuit-1 output branch current under port open-circuit condition, subcircuit-1 output node voltage under port short-circuit condition, subcircuit-1 output branch current under port short-circuit condition) is obtained using frequency-domain method. First, obtain a frequency-spectrum of such steady-state-response. Then, perform inverse fast Fourier transform (IFFT) on the frequency-spectrum to obtain the steady-state-response value at a series of discrete time-points. The steady-state-response value at other time-points may be obtained by linear interpolation.

In one embodiment, an impulse-response of subcircuit-1 (may include one or more of: impulse-response of subcircuit-1 port voltage to port current, impulse-response of subcircuit-1 port current to port voltage, impulse-response of subcircuit-1 output node voltage to port current, impulse-response of subcircuit-1 output branch current to port current, impulse-response of subcircuit-1 output node voltage to port voltage, impulse-response of subcircuit-1 output branch current to port voltage) is obtained using frequency-domain method. First, obtain a frequency-response of subcircuit-1 (i.e., frequency-spectrum of such impulse-response). Then, perform inverse fast Fourier transform (IFFT) on the frequency-response to obtain the impulse-response value at a series of discrete time-points. The impulse-response value at other time-points may be obtained by linear interpolation.

In some embodiments, the subcircuit-1 and subcircuit-2 may be connected through more than one port. In such embodiments, $i_{port}$, $v_{port}$, $V_{eq}$, $V_{eq,0}$, $i_{eq}$, $i_{eq,0}$, v, $v_0$, i, $i_0$ are vectors of corresponding currents/voltages; $H_{v-eq}$, $H_{i-eq}$, $H_i$, $H_v$ are impulse-response matrices; $R_{eq}$ is branch resistance matrix; $G_{eq}$ is branch conductance matrix.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

As will be appreciated by one skilled in the art, aspects of the present disclosure may be embodied as a method, a system, or a computer program product. Accordingly, aspects of the present disclosure may take the form of an entirely software embodiment (including firmware, resident software, micro-code, etc.), an entirely hardware embodiment, or an embodiment combining software and hardware aspects that may all generally be referred to herein as a "circuit," "module," "apparatus" or "system." Furthermore, aspects of the present disclosure may take the form of a computer program product embodied in one or more computer readable medium(s) having computer readable program code embodied thereon.

The present disclosure may be a method, a system, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of methods, apparatuses and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carryout combinations of special purpose hardware and computer instructions.

While the foregoing is directed to embodiments of the present disclosure, other and further embodiments of the disclosure may be devised without departing from the basic scope thereof, and the scope thereof is determined by the claims that follow.

What is claimed is:

1. A computer-implemented method for circuit simulation, comprising:
    partitioning a circuit into a subcircuit-1 and a subcircuit-2 which are connected through at least one port; and
    simulating a circuit comprising the subcircuit-2 and an equivalent circuit of the subcircuit-1, wherein the equivalent circuit comprises a subcircuit selected from the group consisting of:
        (a) an equivalent voltage in series with an equivalent resistance, wherein the equivalent voltage is obtained by: convolving a port current with an impulse-response of subcircuit-1 port voltage to port current, to obtain a transient-equivalent-voltage; and adding the transient-equivalent-voltage to a subcircuit-1 port voltage under port open-circuit condition, and wherein the equivalent resistance is obtained from a selected point of the impulse-response,
        (b) an equivalent voltage, wherein the equivalent voltage is obtained by: convolving a port current with an impulse-response of subcircuit-1 port voltage to port current, to obtain a transient-equivalent-voltage; and adding the transient-equivalent-voltage to a subcircuit-1 port voltage under port open-circuit condition,
        (c) an equivalent current in parallel with an equivalent conductance, wherein the equivalent current is obtained by: convolving a port voltage with an impulse-response of subcircuit-1 port current to port voltage, to obtain a transient-equivalent-current; and adding the transient-equivalent-current to a subcircuit-1 port current under port short-circuit condition, and wherein the equivalent conductance is obtained from a selected point of the impulse-response, and
        (d) an equivalent current, wherein the equivalent current is obtained by: convolving a port voltage with an impulse-response of subcircuit-1 port current to port voltage, to obtain a transient-equivalent-current; and adding the transient-equivalent-current to a subcircuit-1 port current under port short-circuit condition.

2. The method as described in claim 1, wherein circuit elements in the subcircuit-1 are linear-time-invariant.

3. The method as described in claim 1, further comprising:
    obtaining subcircuit-1 output node voltage by: convolving a port current with an impulse-response of subcircuit-1 output node voltage to port current, to obtain a transient-node-voltage; and
    adding the transient-node-voltage to a subcircuit-1 output node voltage under port open-circuit condition; and
    obtaining subcircuit-1 output branch current by: convolving a port current with an impulse-response of subcircuit-1 output branch current to port current, to obtain a transient-branch-current; and
    adding the transient-branch-current to a subcircuit-1 output branch current under port open-circuit condition.

4. The method as described in claim 1, further comprising:
    obtaining subcircuit-1 output node voltage by: convolving a port voltage with an impulse-response of subcircuit-1 output node voltage to port voltage, to obtain a transient-node-voltage; and adding the transient-node-voltage to a subcircuit-1 output node voltage under port short-circuit condition; and obtaining subcircuit-1 output branch current by: convolving a port voltage with an impulse-response of subcircuit-1 output branch current to port voltage, to obtain a transient-branch-current; and adding the transient-branch-current to a subcircuit-1 output branch current under port short-circuit condition.

5. The method as described in claim 1, further comprising:
providing a subcircuit-1 port voltage under port open-circuit condition; and
providing an impulse-response of subcircuit-1 port voltage to port current.

6. The method as described in claim 1, further comprising:
providing a subcircuit-1 port current under port short-circuit condition; and
providing an impulse-response of subcircuit-1 port current to port voltage.

7. A system, comprising:
a processor; and
a memory storing instructions that, when executed by the processor, cause the processor to perform an operation for circuit simulation, the operation comprising:
partitioning a circuit into a subcircuit-1 and a subcircuit-2 which are connected through at least one port; and
simulating a circuit comprising the subcircuit-2 and an equivalent circuit of the subcircuit-1, wherein the equivalent circuit comprises a subcircuit selected from the group consisting of:
(a) an equivalent voltage in series with an equivalent resistance, wherein the equivalent voltage is obtained by: convolving a port current with an impulse-response of subcircuit-1 port voltage to port current, to obtain a transient-equivalent-voltage; and adding the transient-equivalent-voltage to a subcircuit-1 port voltage under port open-circuit condition, and wherein the equivalent resistance is obtained from a selected point of the impulse-response,
(b) an equivalent voltage, wherein the equivalent voltage is obtained by: convolving a port current with an impulse-response of subcircuit-1 port voltage to port current, to obtain a transient-equivalent-voltage; and adding the transient-equivalent-voltage to a subcircuit-1 port voltage under port open-circuit condition,
(c) an equivalent current in parallel with an equivalent conductance, wherein the equivalent current is obtained by: convolving a port voltage with an impulse-response of subcircuit-1 port current to port voltage, to obtain a transient-equivalent-current; and adding the transient-equivalent-current to a subcircuit-1 port current under port short-circuit condition, and wherein the equivalent conductance is obtained from a selected point of the impulse-response, and
(d) an equivalent current, wherein the equivalent current is obtained by: convolving a port voltage with an impulse-response of subcircuit-1 port current to port voltage, to obtain a transient-equivalent-current; and adding the transient-equivalent-current to a subcircuit-1 port current under port short-circuit condition.

8. The system as described in claim 7, wherein circuit elements in the subcircuit-1 are linear-time-invariant.

9. The system as described in claim 7, further comprising:
obtaining subcircuit-1 output node voltage by: convolving a port current with an impulse-response of subcircuit-1 output node voltage to port current, to obtain a transient-node-voltage; and adding the transient-node-voltage to a subcircuit-1 output node voltage under port open-circuit condition; and obtaining subcircuit-1 output branch current by: convolving a port current with an impulse-response of subcircuit-1 output branch current to port current, to obtain a transient-branch-current; and adding the transient-branch-current to a subcircuit-1 output branch current under port open-circuit condition.

10. The system as described in claim 7, further comprising:
obtaining subcircuit-1 output node voltage by: convolving a port voltage with an impulse-response of subcircuit-1 output node voltage to port voltage, to obtain a transient-node-voltage; and adding the transient-node-voltage to a subcircuit-1 output node voltage under port short-circuit condition; and obtaining subcircuit-1 output branch current by: convolving a port voltage with an impulse-response of subcircuit-1 output branch current to port voltage, to obtain a transient-branch-current; and adding the transient-branch-current to a subcircuit-1 output branch current under port short-circuit condition.

11. The system as described in claim 7, further comprising:
providing a subcircuit-1 port voltage under port open-circuit condition; and
providing an impulse-response of subcircuit-1 port voltage to port current.

12. The system as described in claim 7, further comprising:
providing a subcircuit-1 port current under port short-circuit condition; and
providing an impulse-response of subcircuit-1 port current to port voltage.

13. A computer readable storage medium having stored thereon instructions that when executed by a processor causes a processor to perform an operation for circuit simulation, comprising:
partitioning a circuit into a subcircuit-1 and a subcircuit-2 which are connected through at least one port; and
simulating a circuit comprising the subcircuit-2 and an equivalent circuit of the subcircuit-1, wherein the equivalent circuit comprises a subcircuit selected from the group consisting of:
(a) an equivalent voltage in series with an equivalent resistance, wherein the equivalent voltage is obtained by: convolving a port current with an impulse-response of subcircuit-1 port voltage to port current, to obtain a transient-equivalent-voltage; and adding the transient-equivalent-voltage to a subcircuit-1 port voltage under port open-circuit condition, and wherein the equivalent resistance is obtained from a selected point of the impulse-response,
(b) an equivalent voltage, wherein the equivalent voltage is obtained by: convolving a port current with an impulse-response of subcircuit-1 port voltage to port current, to obtain a transient-equivalent-voltage; and adding the transient-equivalent-voltage to a subcircuit-1 port voltage under port open-circuit condition,
(c) an equivalent current in parallel with an equivalent conductance, wherein the equivalent current is obtained by: convolving a port voltage with an impulse-response of subcircuit-1 port current to port voltage, to obtain a transient-equivalent-current; and adding the transient-equivalent-current to a subcircuit-1 port current under port short-circuit condition, and wherein the equivalent conductance is obtained from a selected point of the impulse-response, and (d) an equivalent current, wherein the equivalent current is obtained by: convolving a port voltage with an impulse-response of subcircuit-1 port current to port voltage, to obtain a transient-equivalent-current; and adding the transient-equivalent-current to a subcircuit-1 port current under port short-circuit condition.

14. The computer readable storage medium as described in claim 13, wherein circuit elements in the subcircuit-1 are linear-time-invariant.

15. The computer readable storage medium as described in claim 13, further comprising:

obtaining subcircuit-1 output node voltage by: convolving a port current with an impulse-response of subcircuit-1 output node voltage to port current, to obtain a transient-node-voltage; and adding the transient-node-voltage to a subcircuit-1 output node voltage under port open-circuit condition; and obtaining subcircuit-1 output branch current by: convolving a port current with an impulse-response of subcircuit-1 output branch current to port current, to obtain a transient-branch-current; and adding the transient-branch-current to a subcircuit-1 output branch current under port open-circuit condition.

16. The computer readable storage medium as described in claim 13, further comprising:

obtaining subcircuit-1 output node voltage by: convolving a port voltage with an impulse-response of subcircuit-1 output node voltage to port voltage, to obtain a transient-node-voltage; and adding the transient-node-voltage to a subcircuit-1 output node voltage under port short-circuit condition; and obtaining subcircuit-1 output branch current by: convolving a port voltage with an impulse-response of subcircuit-1 output branch current to port voltage, to obtain a transient-branch-current; and adding the transient-branch-current to a subcircuit-1 output branch current under port short-circuit condition.

17. The computer readable storage medium as described in claim 13, further comprising:

providing a subcircuit-1 port voltage under port open-circuit condition; and providing an impulse-response of subcircuit-1 port voltage to port current.

18. The computer readable storage medium as described in claim 13, further comprising:

providing a subcircuit-1 port current under port short-circuit condition; and providing an impulse-response of subcircuit-1 port current to port voltage.

* * * * *